(12) United States Patent
Hwang

(10) Patent No.: US 8,896,064 B2
(45) Date of Patent: Nov. 25, 2014

(54) ELECTROSTATIC DISCHARGE PROTECTION CIRCUIT

(75) Inventor: Hsin-Yen Hwang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 720 days.

(21) Appl. No.: 12/906,498

(22) Filed: Oct. 18, 2010

(65) Prior Publication Data

US 2012/0092798 A1    Apr. 19, 2012

(51) Int. Cl.
*H02H 9/00*    (2006.01)
*H01L 29/87*    (2006.01)
*H01L 27/02*    (2006.01)

(52) U.S. Cl.
CPC ............ *H01L 27/0259* (2013.01); *H01L 29/87* (2013.01); *H01L 27/0262* (2013.01)
USPC ............................. 257/355; 257/173; 257/546

(58) Field of Classification Search
USPC .......................................... 257/546, 355, 173
See application file for complete search history.

(56) References Cited

U.S. PATENT DOCUMENTS

| | | | |
|---|---|---|---|
| 5,821,572 A * | 10/1998 | Walker et al. ................. | 257/107 |
| 5,966,599 A * | 10/1999 | Walker et al. ................. | 438/228 |
| 6,072,216 A * | 6/2000 | Williams et al. .............. | 257/339 |
| 6,169,309 B1 * | 1/2001 | Teggatz et al. ................ | 257/328 |
| 6,207,484 B1 * | 3/2001 | Kim et al. ..................... | 438/209 |
| 6,274,898 B1 * | 8/2001 | Mehta et al. .................. | 257/298 |
| 6,586,317 B1 * | 7/2003 | Vashchenko et al. ......... | 438/510 |
| 6,977,425 B2 * | 12/2005 | Yoshida et al. ............... | 257/517 |
| 7,384,802 B2 | 6/2008 | Lee et al. | |
| 7,538,997 B2 | 5/2009 | Mallikararjunaswamy | |
| 7,638,857 B2 * | 12/2009 | Hwang et al. ................. | 257/603 |
| 7,732,834 B2 * | 6/2010 | Russ et al. ..................... | 257/173 |
| 7,875,933 B2 * | 1/2011 | Schneider et al. ............ | 257/355 |
| 7,933,102 B2 * | 4/2011 | Mallikararjunaswamy .... | 361/56 |
| 8,012,842 B2 * | 9/2011 | Balster et al. ................. | 438/353 |

(Continued)

FOREIGN PATENT DOCUMENTS

CN    1913148 A    2/2007
CN    101490820 A    7/2009

OTHER PUBLICATIONS

Chong, Y.R., et al., "Reliability Analyses for New Improved High Performance Flip Chip BGA Packages," Electronics Packaging Technology Conference, 5th Conference, 2003, pp. 695-700.

(Continued)

*Primary Examiner* — Eugene Lee
(74) *Attorney, Agent, or Firm* — Slater and Matsil, L.L.P.

(57) ABSTRACT

An electrostatic discharge (ESD) protection structure comprises a high voltage P type implanted region disposed underneath an N+ region. The high voltage P type implanted region and the N+ region form a reverse diode or a Zener diode depending on different doping densities. The ESD protection structure further comprises a plurality of P+ and N+ regions. The high voltage P type implanted region and the P+ and N+ regions form a semiconductor device having a breakdown characteristic. In one embodiment, the semiconductor device may be a bipolar PNP transistor. The bipolar PNP transistor and a Zener diode in series connection form an ESD protection circuit. In another embodiment, the semiconductor device may be a Silicon-Controlled Rectifier (SCR), which is series-connected with a reverse diode. Both embodiments provide a reliable ESD protection.

14 Claims, 8 Drawing Sheets

(56) References Cited

U.S. PATENT DOCUMENTS

| | | | |
|---|---|---|---|
| 2002/0195657 A1* | 12/2002 | Williams et al. | 257/332 |
| 2007/0194380 A1* | 8/2007 | Okushima | 257/355 |
| 2008/0067585 A1* | 3/2008 | Williams et al. | 257/330 |
| 2009/0115018 A1* | 5/2009 | Mallikarjunaswamy | 257/517 |
| 2009/0278168 A1 | 11/2009 | Hwang et al. | |
| 2011/0180845 A1* | 7/2011 | Mallikarjunaswamy | 257/173 |
| 2012/0182694 A1 | 7/2012 | Lin et al. | |

OTHER PUBLICATIONS

Too, S. S., et al., "Effects of Organic Package Warpage on Microprocessor Thermal Performance," Electronic Components and Technology Conference, Proceedings. $57^{th}$, 2007, pp. 748-754.

Xiong, B., et al., "Warpage Improvement for Large Die Flip Chip Package," $11^{th}$ Electronics Packaging Technology Conference, 2009, pp. 40-43.

* cited by examiner

US 8,896,064 B2

ELECTROSTATIC DISCHARGE PROTECTION CIRCUIT

BACKGROUND

Electrostatic Discharge (ESD) is a rapid discharge that flows between two objects due to the built-up of static charge. ESD may destroy semiconductor devices because the rapid discharge can produce a relatively large current. In order to reduce the semiconductor failures due to ESD, ESD protection circuits have been developed to provide a current discharge path. When an ESD event occurs, the discharge current is conducted through the discharge path without going through the internal circuits to be protected.

In the semiconductor technology, NMOS transistors, Silicon-Controlled Rectifiers (SCRs) and RC triggered PMOS transistors are widely used. However, with the advance of submicron semiconductor processes, the existing ESD protection solutions may not meet the ever-increasing requirements from the semiconductor industry. For example, in a high voltage application, SCR or NMOS based ESD protection circuits may cause a latch-up failure because the holding voltage is not high enough. On the other hand, despite having a relatively high holding voltage, a RC triggered PMOS transistor may consume a large die area.

Accordingly, what is needed in the art is an ESD protection circuit having a high holding voltage. More particularly, the ESD protection circuit is capable of providing a reliable protection with an optimized semiconductor die size.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
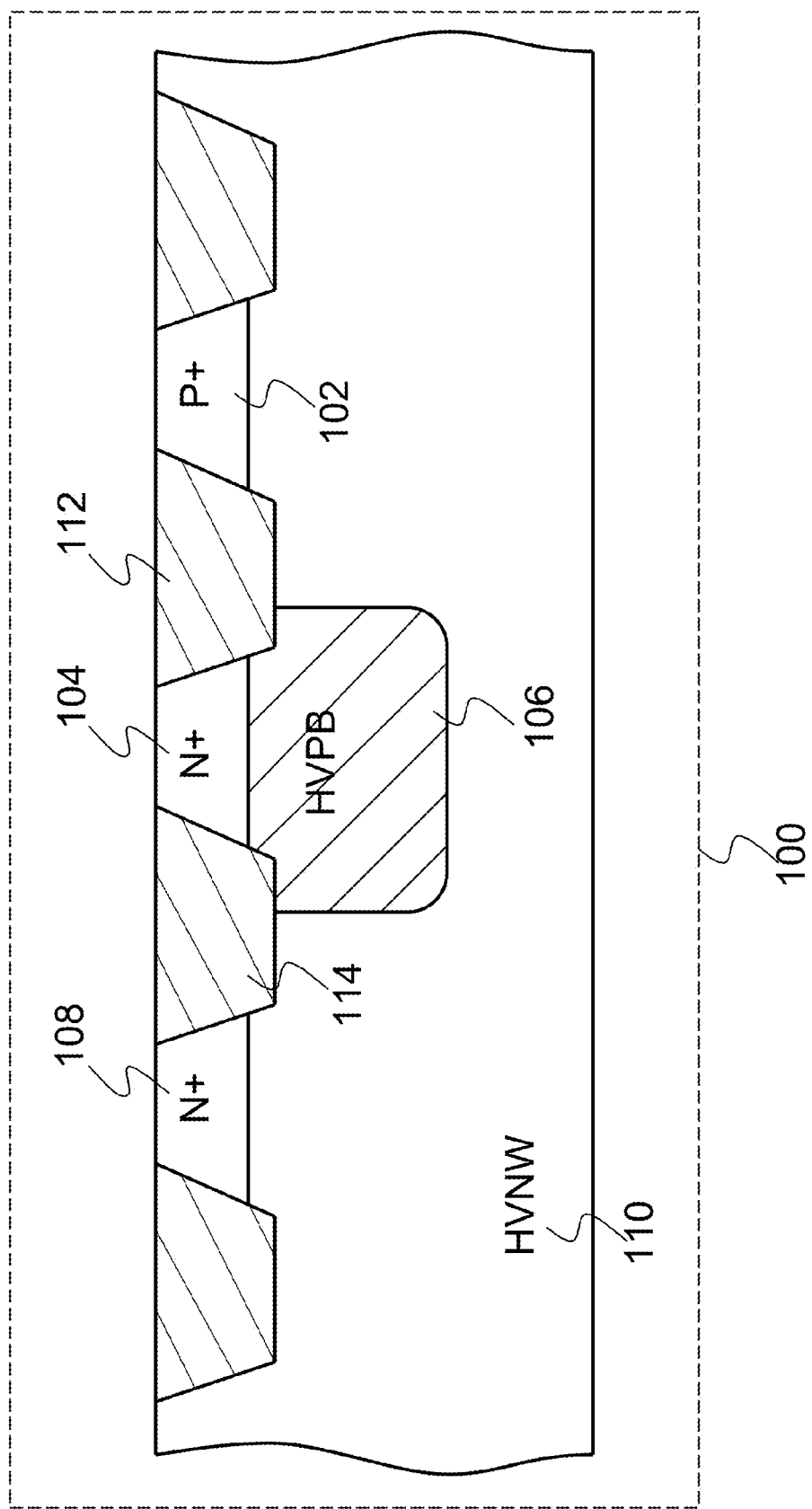
FIG. 1 illustrates a simplified cross section view of an ESD protection structure in accordance with an embodiment.

FIG. 1 illustrates a simplified cross section view of an ESD protection structure 100 in accordance with an embodiment. The ESD protection structure 100 includes a P+ region 102, a first N+ region 104, a second N+ region 108, a first isolated region 112, a second isolated region 114, a high voltage P type implanted region 106 and a High Voltage N Well (HVNW) 110. The first N+ region 104 and the high voltage P type implanted region 106 are sequentially disposed on the HVNW 110. The high voltage P type implanted region 106 is disposed below the first N+ region 104. The P+ region 102 is disposed in the HVNW 110 at one side of the first N+ region 104. The P+ region 102 is separated from the first N+ region 104 by the first isolated region 112. The second N+ region 108 is disposed in the HVNW 110 at the other side of the first N+ region 104. The second N+ region 108 is separated from the first N+ region 104 by the second isolated region 114. For ESD protection applications, the first N+ region 104 is typically coupled to an input/output (I/O) pad and the P+ region 102 is typically coupled to a power supple VSS pad, which is typically grounded.

Figure 2:
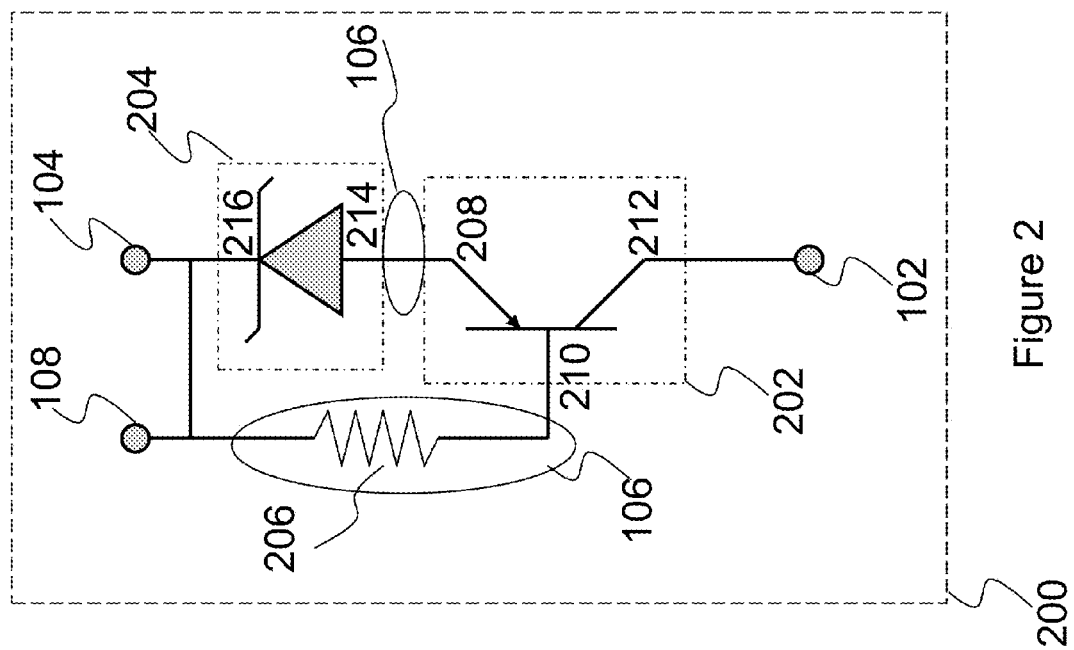
FIG. 2 illustrates an equivalent circuit diagram of the ESD protection structure illustrated in FIG. 1.

FIG. 2 illustrates an equivalent circuit diagram of the ESD protection structure 100 illustrated in FIG. 1. The equivalent circuit of the ESD protection structure illustrated in FIG. 1 includes a Zener diode 204, a bipolar PNP transistor 202 and a resistor 206. Referring again to FIG. 1, the high voltage P type implanted region 106 is disposed underneath the first N+ region 104. The junction between the high voltage P type implanted region 106 and the first N+ region 104 forms the Zener diode 204 as shown in FIG. 2. The Zener diode 204 has a cathode 216 and an anode 214. The cathode 216 is located in the first N+ region 104. The anode 214 is located in the high voltage P type implanted region 106. The Zener diode 204 has a typical breakdown voltage of 5V. Depending on the diffusion parameters of both the first N+ region 104 and the high voltage P type implanted region 106, the breakdown voltage of the Zener diode 204 can be up to 7V.

However, as one of ordinary skill in the art will recognize, the above described Zener diode 204 and its associated semiconductor structure is merely exemplary and is not intended to limit the present invention in any fashion. By selecting different diffusion parameters, any suitable Zener voltage rating may be utilized in the ESD protection circuit described above.

The bipolar PNP transistor 202 has an emitter 208, a base 210 and a collector 212. The emitter 208, the base 210 and the collector 212 are formed by the P+ region 102, the HVNW 110 and the high voltage P type implanted region 106 respectively (HVNW 110 is not shown but illustrated in FIG. 1). The emitter 208 is coupled to the anode 214 of the Zener diode 204. The base 210 is coupled to the second N+ region 108 through a resistor 206. The resistor 206 represents the parasitic resistance in the HVNW 110 (not shown but illustrated in FIG. 1). In sum, a simplified circuit diagram 200 depicts that the corresponding circuit of the ESD protection structure 100 is formed by a series connection of the Zener diode 204 and the bipolar PNP transistor 202.

However, it should be recognized that while FIG. 2 illustrates the ESD protection circuit with one Zener diode and one bipolar PNP transistor (e.g., Zener 204 and PNP transistor 202), the ESD protection circuit could accommodate any numbers of Zener diodes and bipolar PNP transistors. Furthermore, it is understood that the ESD protection circuit may be implemented using a plurality of Zener diodes or bipolar PNP transistors in series connection. On the other hand, other configurations of a plurality of Zener diodes and bipolar PNP transistors such as parallel-connected Zener diodes coupled to parallel-connected bipolar PNP transistors are also within the contemplated scope of this embodiment.

As known in the art, the bipolar PNP transistor 202 has a breakdown voltage. When a large voltage spike is applied between the emitter 208 and the collector 212, the bipolar PNP transistor 202 may experience an avalanche breakdown in which a large current is allowed to flow from the emitter 208 to the collector 212. The current path from the emitter 208 to the collector 212 may provide a bypass of the ESD current and clamp the voltage between the emitter 208 and the collector 212 to a level below the maximum rating voltage of the internal circuit, so that it helps to prevent the large voltage spike from damaging the internal circuits being protected. Similarly, the Zener diode 204 has a breakdown voltage (e.g., 5V) when a voltage is applied between the cathode 216 and the anode 214. In sum, the ESD protection circuit 200 has a breakdown voltage equivalent to the bipolar PNP transistor's 202 breakdown voltage plus the Zener's 204 breakdown voltage.

Figure 7:
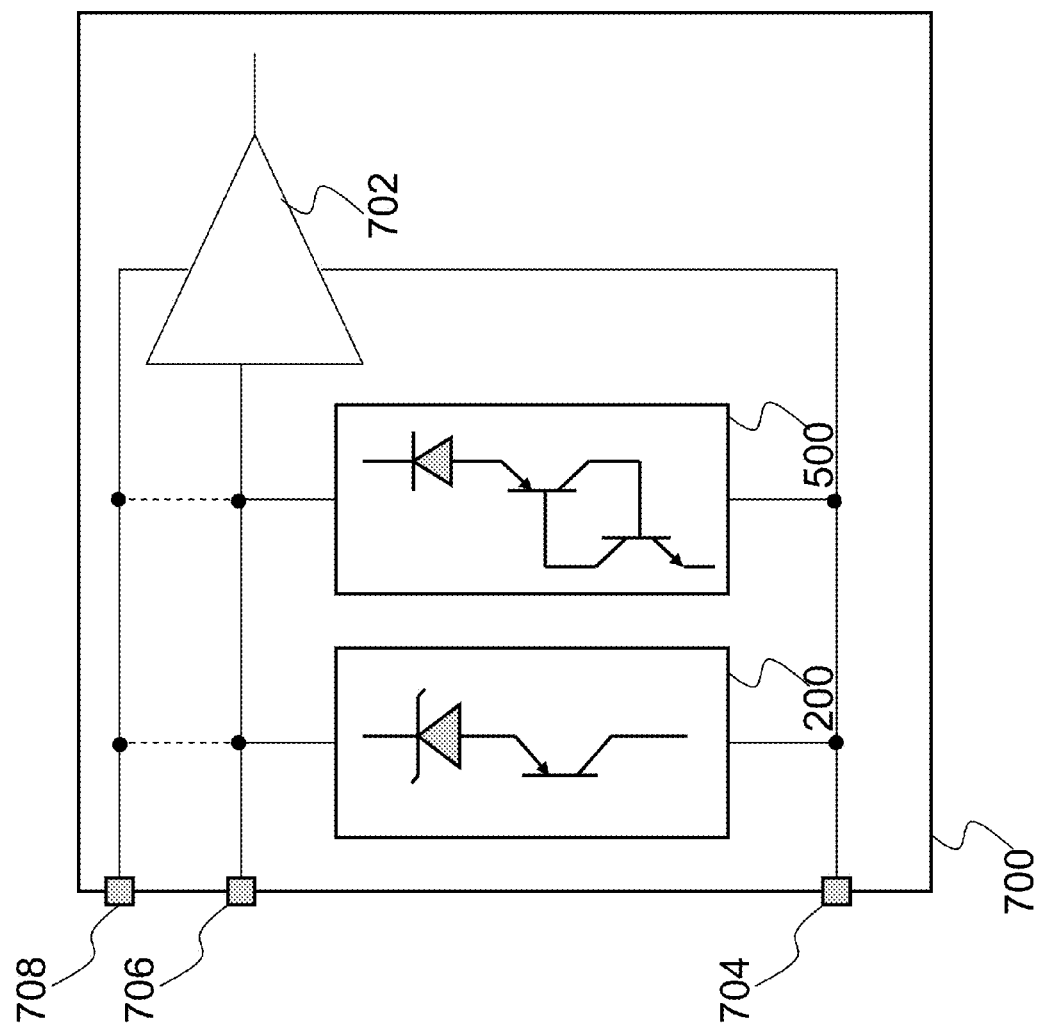
FIG. 7 illustrates an integrated circuit level ESD protection diagram.

The ESD protection circuit 200 is typically placed at an I/O pad and a VSS of a device to be protected (not shown but illustrated in FIG. 7). The first N+ region 104 is typically coupled to the I/O pad and the P+ region 102 is typically coupled to the VSS, which is typically grounded. If an ESD event occurs, a voltage spike is applied between the first N+ region 104 and the P+ region 102. Firstly, both the Zener diode 204 and the bipolar PNP transistor 202 experience the voltage spike, which may exceed both the Zener diode 204 and the bipolar PNP transistor 202's breakdown voltages. The Zener diode 204 allows the ESD current to flow from the cathode 216 to the anode 214 when the voltage across the cathode 216 and the anode 214 exceeds the Zener diode's 204 breakdown voltage (e.g., 5V). In addition, the Zener diode 204 may clamp the voltage between the cathode 216 and the anode 214 to its breakdown voltage (e.g., 5V).

Furthermore, if the voltage spike minus 5V still exceeds the breakdown voltage of the bipolar PNP transistor 202, the bipolar PNP transistor 202 enters an avalanche conduction mode. Consequently, the bipolar PNP transistor provides a current path so that the ESD discharge current can flow from the emitter 208 to the collector 212. The conduction of both the Zener 204 and the bipolar PNP 202 clamps the voltage between the cathode 216 and the collector 212 to a lower level so that the internal circuits coupled to the cathode 216 can be protected.

It should be noted that both the Zener diode 204 and the bipolar PNP transistor 202 may turn on nearly simultaneously. However, for convenience the description above uses a slightly earlier turn-on of the Zener diode 204 as an example to describe the breakdown mechanism. It is understood that the turn-on sequence between the Zener diode 204 and the bipolar PNP transistor 202 plays no role in this embodiment. The breakdowns of two series-connected elements (e.g., Zener diode 204 and PNP transistor 202) in the ESD protection circuit 200 may be performed in any arbitrary sequence. However, the specifically discussed example above is preferred.

Referring again to FIG. 2, the base 210 is coupled to the cathode 216 through a resistor 206. In this embodiment, the resistor 206 represents the body resistance of the HVNW 110. It should be noted that the resistance between the base 210 and the emitter 208 may have an impact on the collector-emitter breakdown voltage of the bipolar PNP transistor 202. The direct connection between the second N+ region 108 and the first N+ region 104 is provided for illustrative purpose only, and is provided only to provide an example of the functionality that may be included in this embodiment. One of ordinary of skill in the art will realize that in ESD protection applications, the second N+ region 108 may be floating or coupled to the first N+region through an external resistor outside the ESD protection structure 100.

Figure 3:
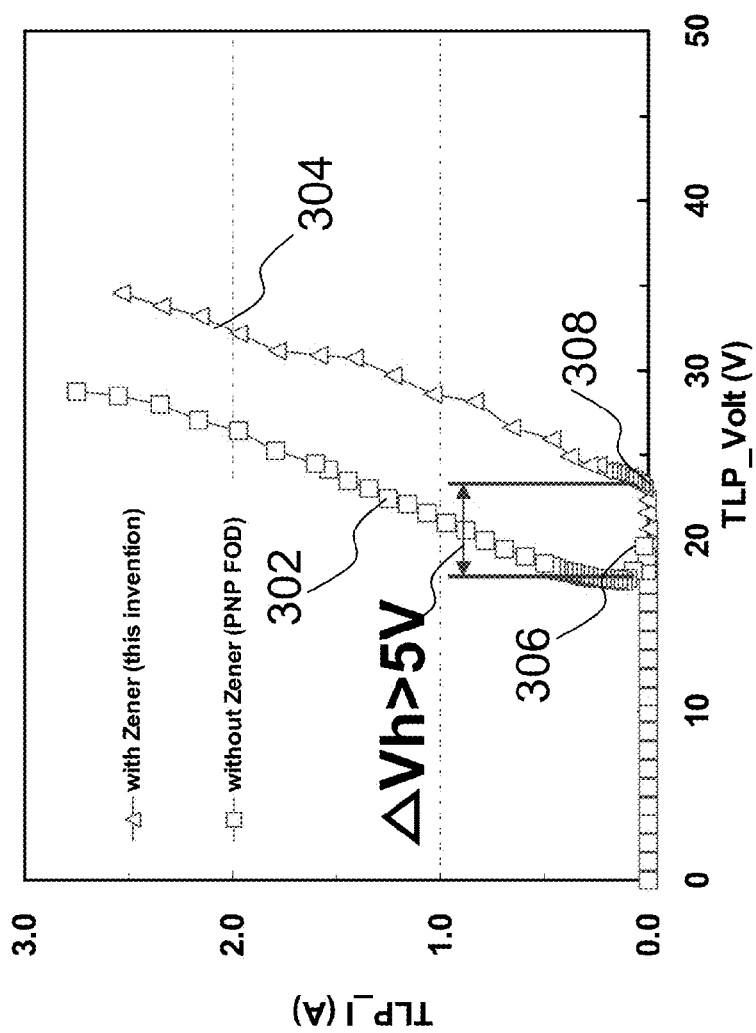
FIG. 3 illustrates I-V curves of a conventional ESD protection circuit and the ESD protection circuit in FIG. 2.

FIG. 3 illustrates I-V curves of a conventional ESD protection circuit such as a PNP field oxide device and the ESD protection circuit 200 in FIG. 2. The horizontal axis of FIG. 3 represents the ESD voltage across an ESD protection circuit (e.g., the ESD protection circuit 200). The vertical axis of FIG. 3 represents the ESD current flowing through the ESD protection circuit. A curve 302 illustrates the current flowing through a conventional ESD protection circuit as a voltage spike is applied. A square on the curve 302 indicates a corresponding ESD voltage at the horizontal axis and a corresponding ESD current at the vertical axis. As shown in FIG. 3, a square 306 indicates a breakdown voltage for a conventional ESD protection circuit. On the curve 302, before the applied voltage reaches the square 306, the ESD current is approximately equal to zero. Once the applied ESD voltage exceeds the square 306 where the corresponding ESD voltage is about 18V, the ESD current increases in proportion to the applied ESD voltage. In this embodiment, the peak ESD current of the conventional ESD protection circuit is up to about 3 A with a holding voltage approximately 30V.

The curve 304 represents the I-V relationship for the ESD protection circuit 200 during an ESD test. Similarly, the isosceles triangles on the curve 304 indicate the I-V relationship of the ESD protection circuit 200. An isosceles triangle 308 as shown in FIG. 3 indicates the breakdown voltage of the ESD protection circuit 200 (approximately 23V as illustrated in FIG. 3). After a resulting breakdown, the curve 304 is about in parallel with the curve 302 but having a voltage gap, which is about 5V as illustrated in FIG. 3. An advantageous feature of the described embodiment is the Zener diode 204 helps to provide a higher ESD breakdown voltage.

Figure 4:
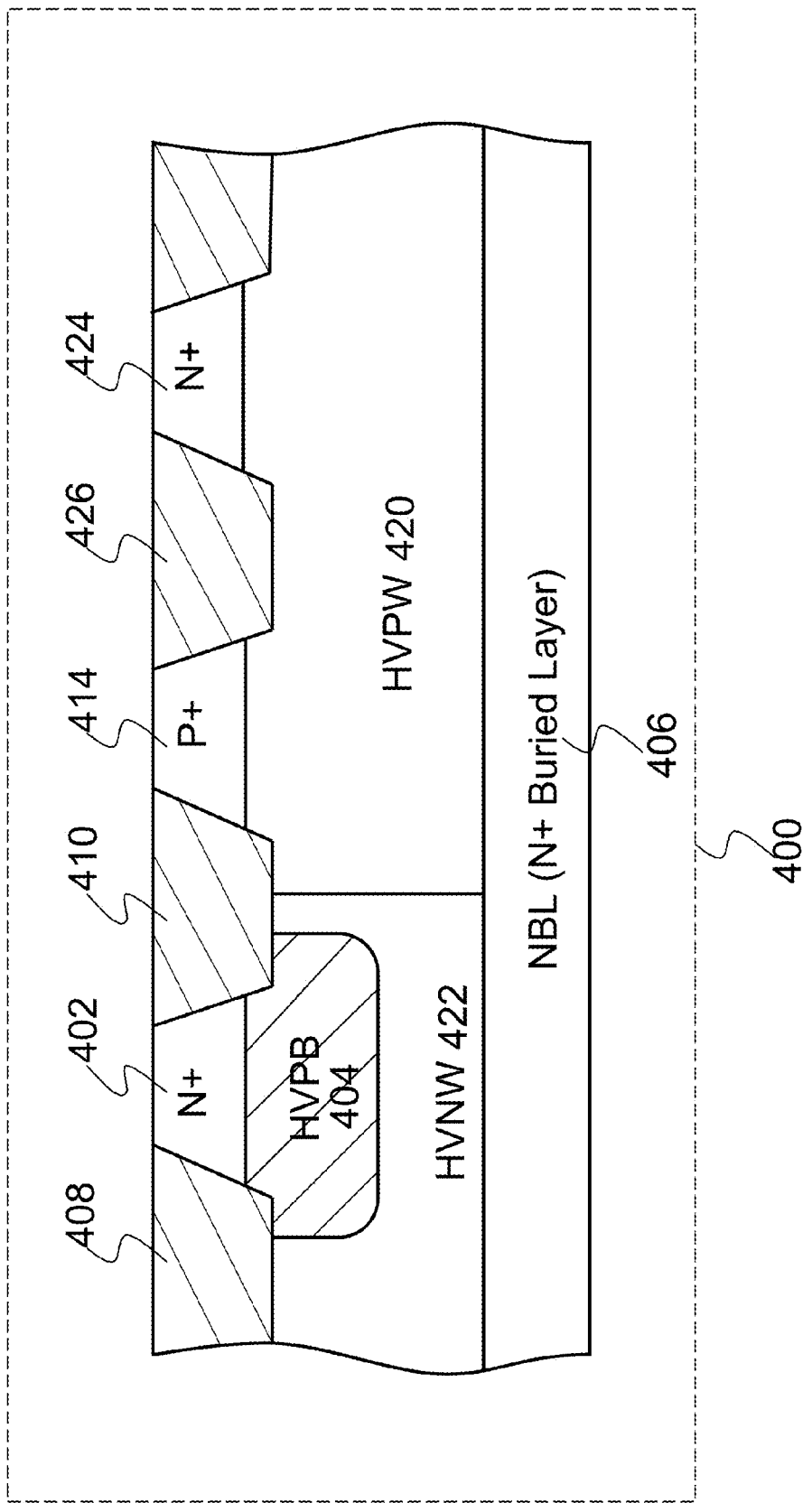
FIG. 4 illustrates a simplified cross section view of an ESD protection circuit in accordance with another embodiment.

FIG. 4 illustrates a simplified cross section view of an ESD protection structure 400 in accordance with another embodiment. The ESD protection structure 400 includes a first N+ region 402, a P+ region 414, a second N+ region 424, a first isolated region 408, a second isolated region 410 and a third isolated region 426. The first N+ region 402 is isolated from the P+ region 414 by the second isolated region 410. Likewise, the second N+ region 424 is separated from the P+ region 414 by the third isolated region 426. The ESD protection structure 400 further includes a high voltage P type implanted region 404, a HVNW 422, a High Voltage P Well (HVPW) 420 and an N+Buried Layer (NBL) 406. The high voltage P type implanted region 404 and the first N+ region 402 are sequentially disposed on the HVNW 422. The high voltage P type implanted region 404 is disposed below the first N+ region 402. Both the P+region 414 and the second N+ region 424 are disposed in the HVPW 420. Both the HVNW 422 and HVPW 420 are disposed on the NBL 406. For ESD protection applications, the first N+region 402 is typically coupled to an input/output (I/O) pad and the second N+ region 424 is typically coupled to a power supple VSS pad, which is typically grounded.

Figure 5:
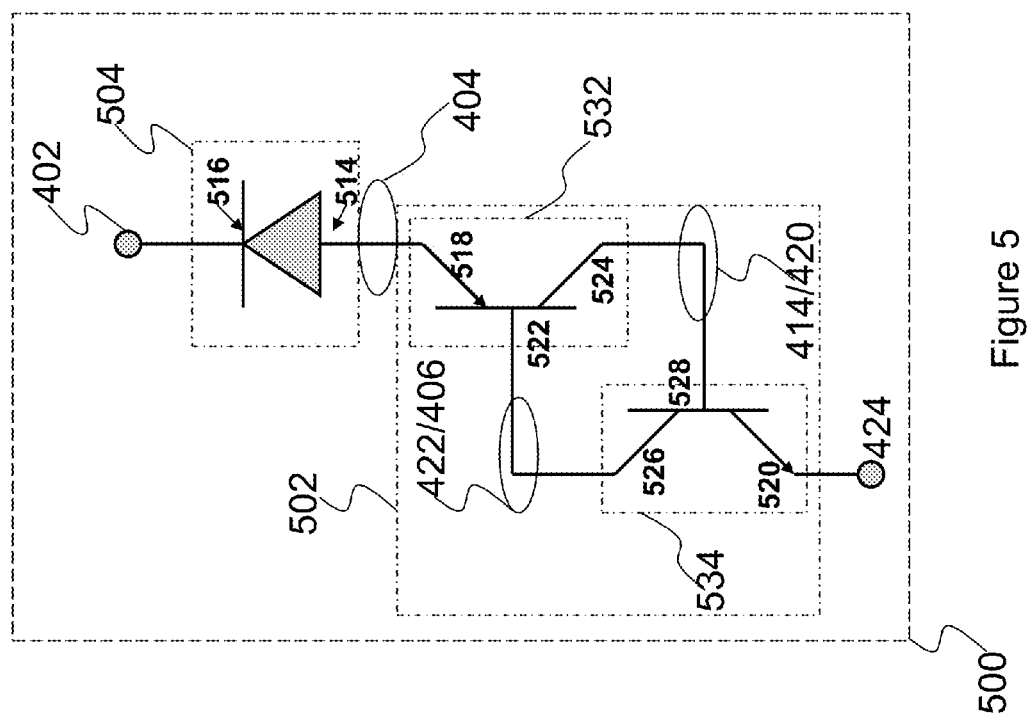
FIG. 5 illustrates an equivalent circuit diagram of the ESD protection structure illustrated in FIG. 4.

FIG. 5 illustrates an equivalent circuit diagram of the ESD protection structure 400 illustrated in FIG. 4. The equivalent circuit includes a reverse diode 504 and a Silicon-Controlled Rectifier (SCR) 502. As described above, the first N+ region 402 is disposed on top of the high voltage P type implanted region 404. The junction between the high voltage P type implanted region 404 and the first N+ region 402 forms the reverse diode 504. The reverse diode 504 has a cathode 516 and an anode 514. The cathode 516 is located in the first N+ region 402. The anode 514 is located in the high voltage P type implanted region 504. The breakdown voltage of the reverse diode 504 may depend on several semiconductor diffusion parameters, such as the doping density of the high voltage P type implanted region 404.

The SCR 502 includes a bipolar PNP transistor 532 having a first emitter 518, a first base 522 and a first collector 524, and a bipolar NPN transistor 534 having a second emitter 520, a second base 528 and a second collector 526. The first emitter 518, the first base 522 and the first collector 524 are formed by the high voltage P type implanted region 404, the HVNW 422 and the HVPW 420 respectively (not shown but illustrated in FIG. 4). The second collector 526, the second base 528 and the second emitter 520 are formed by the HVNW 422, the HVPW 420 and the second N+ region 424 respectively (not shown but illustrated in FIG. 4). As shown in FIG. 5, the first base 522 of the bipolar PNP transistor 532 is tied to the second collector 526 of the bipolar NPN transistor 534, and the second collector 524 of the bipolar PNP transistor 532 is tied to the second base 528 of the bipolar NPN transistor 534. The SCR 502, as an independent block typically has two terminals (e.g. the first emitter 518 and the second emitter 520) exposed to the outside circuits. In this embodiment, the first emitter 518 is coupled to the anode 514. The second emitter 520 is coupled to the second N+ region 424. In sum, a simplified equivalent circuit diagram 500 illustrates an ESD protection circuit having a reverse diode 504 in series connection with the SCR 502.

As known in the art, the SCR (e.g., the SCR 502 shown in FIG. 5) has a characteristic called "snapback," which means that when a high voltage spike is applied to an SCR, the SCR may be turned on. In FIG. 5, the SCR 502 may be turned on after a voltage spike is applied between the first emitter 518 and the second emitter 520. The ESD current flows through the SCR 502, so that the voltage between the first emitter 518 and the second emitter 520 snaps back and is lowered. The voltage across the SCR 502 after a snapback may be partially determined by the doping densities in the HVNW 422 and HVPW 420 (not shown but illustrated in FIG. 4). The lower voltage across the SCR 502 may prevent the large voltage spike from damaging the internal circuits being protected.

The ESD protection circuit 500 is typically placed at an I/O pad and a VSS of a device to be protected. In FIG. 5, the first N+ region 402 is typically coupled to the I/O pad and the second N+ region 424 is typically coupled to the VSS, which is typically grounded. If an ESD event occurs, a voltage spike is applied between the first N+ region 402 and the second N+region 424. Firstly, both the reverse diode 504 and the SCR 502 experience the voltage spike, which exceeds both the reverse diode 504 and the SCR 502's breakdown voltages. The reverse diode 504 allows the ESD current to follow from the cathode 516 to the anode 514 when the voltage across the cathode 516 and the anode 514 exceeds the reverse diode's 504 breakdown voltage (e.g., 5V).

Furthermore, if the voltage spike minus 5V still exceeds the breakdown voltage of the SCR 502, the SCR 502 enters the snapback mode. Consequently, the SCR 502 provides a current path so that the ESD discharge current flows into the first emitter 518 and flows out of the second emitter 520. Meanwhile, the breakdowns of both the SCR 502 and the reverse diode 504 clamps the voltage across the ESD protection circuit 500 to a lower voltage level so that the circuits coupled to the ESD protection circuit 500 are protected.

It should be noted that both the SCR 502 and the reverse diode 504 turn on nearly simultaneously. For convenience, the description above assumes that the reverse diode 504 turns on slightly earlier than the SCR 502. This turn-on sequence is merely exemplary and is not intended to limit the present invention in any fashion. Any suitable turn-on sequence between the SCR 502 and the reverse diode 504 may be included in this embodiment.

Figure 6:
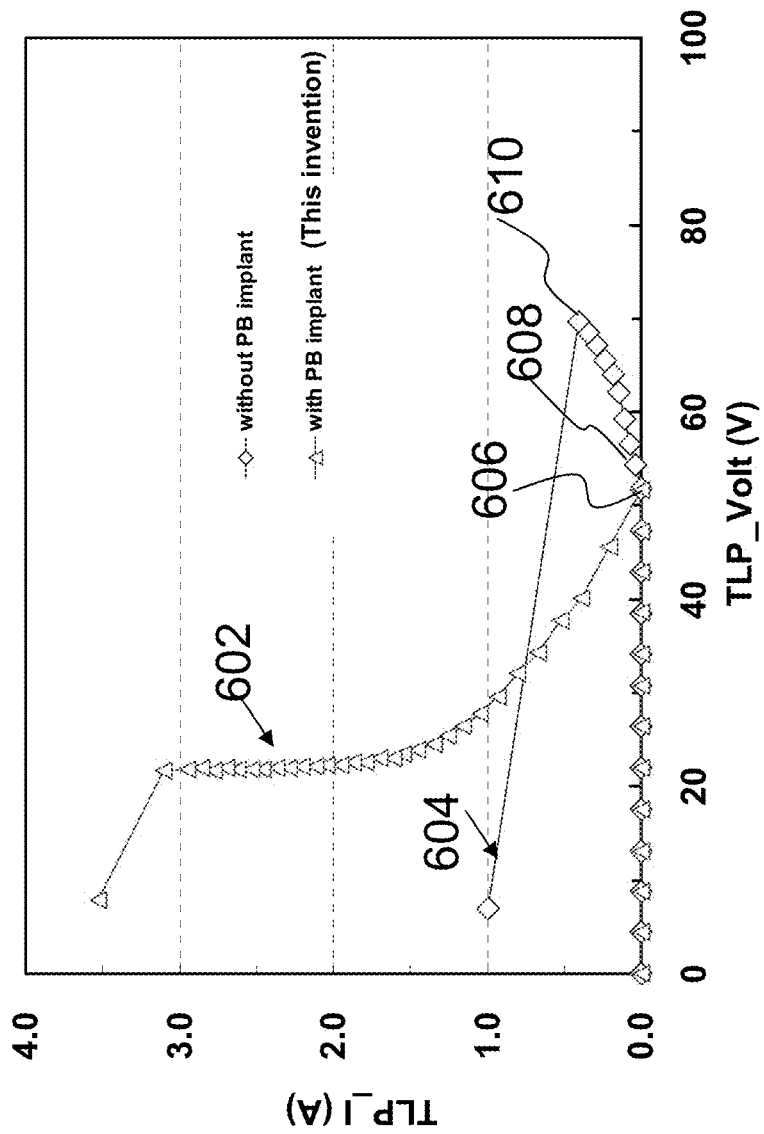
FIG. 6 illustrates I-V curves of a conventional ESD protection circuit not having a high voltage P type implanted region and the ESD protection circuit in FIG. 5.

FIG. 6 illustrates I-V curves of a conventional ESD protection circuit and the ESD protection circuit 500. The horizontal axis of FIG. 6 represents the ESD voltage across an ESD protection circuit (e.g., the ESD protection circuit 500). The vertical axis of FIG. 6 represents the ESD current flowing through the ESD protection circuit. A curve 604 illustrates the current flowing through a conventional ESD protection circuit as a voltage spike is applied. A diamond on the curve 604 indicates a corresponding ESD voltage at the horizontal axis and a corresponding ESD current at the vertical axis.

As shown in FIG. 6, a diamond 608 indicates a breakdown voltage for a conventional ESD protection circuit (approximately 53V as illustrated in FIG. 6). On the curve 604, before the applied voltage reaches the diamond 608, the ESD current is approximately equal to zero. Once the applied ESD voltage exceeds the diamond 608, the ESD current increases slightly in proportion to the applied ESD voltage until the ESD voltage reaches a diamond 610. The gradual slope from the diamond 608 to the diamond 610 indicates the current path has a high resistance, which is not a desired characteristic for an ESD protection circuit. Once the ESD voltage exceeds 70V, the conventional ESD protection circuit has a sharp snapback where the voltage across the conventional ESD protection circuit drops to a low voltage level (e.g., approximately 7V as shown in FIG. 6). This low voltage indicates that the conventional ESD protection circuit may be permanently damaged.

By contrast, the curve 602 illustrates an advantage of the ESD protection circuit 500. The isosceles triangles on the curve 602 indicate the I-V relationship of the ESD protection circuit 500. An isosceles triangle 606 as shown in FIG. 6 indicates the breakdown voltage of the ESD protection circuit 500. After a resulting breakdown, the curve 602 bends back. As a result, the ESD current grows exponentially. In FIG. 6, the ESD current can be up to 3 A. At the same time, the ESD protection circuit 500 has a relatively high holding voltage (e.g., 20V when the ESD current is 3 A). In sum, the ESD protection circuit 500 provides a high ESD current path as well as a relatively high ESD holding voltage. Both features are beneficial to a reliable ESD protection circuit.

FIG. 7 illustrates an integrated circuit level ESD protection diagram. An integrated circuit chip 700 has a VDD pad 708, an I/O pad 706 and a VSS pad 704. Internal circuits 702 are coupled to the VDD pad 708 and VSS pad 704. The internal circuits 702 further include an input coupled to the I/O pad 706. In accordance with an embodiment, both the ESD protection circuit 200 and the ESD protection circuit 500 are coupled between the I/O pad 706 and the VSS pad 704. It should be noted that either the ESD protection circuit 200 or the ESD protection circuit 500 is capable of protecting the internal circuits 702. Both are provided in FIG. 7 for illustrative purpose only.

When an ESD event occurs between the I/O pad 706 and the VSS pad 704, either the ESD protection circuit 200 or the ESD protection circuit 500 conducts the ESD current, and the turn-on of an ESD protection circuit (e.g., the ESD protection circuit 200) clamps the voltage between the I/O pad 706 and the VSS pad 704 below the maximum voltage to which the internal circuits 702 are specified, so that the internal circuits 702 coupled between the I/O pad 706 and the VSS pad 705 are protected. An advantageous feature of the described circuit level ESD protection is the ESD protection circuit provides a bypass for ESD current to flow so that the internal circuits are protected.

It should be noted that both the ESD protection circuit 200 and the ESD protection circuit 500 may be coupled between the VDD pad 708 and the VSS pad 704 as indicated by the dashed lines in FIG. 7. When an ESD event occurs between the VDD pad 708 and the VSS pad 704, the conduction of an ESD protection circuit clamps the voltage between the VDD pad 708 and the VSS pad 704, so that the internal circuits such as internal circuits 702 are protected. In short, the connection of ESD devices 200 and 500 in FIG. 7 is merely an example, which should not unduly limit the scope of the claims. One skilled in the art will recognize many variations, alternatives, and modifications.

Figure 8:
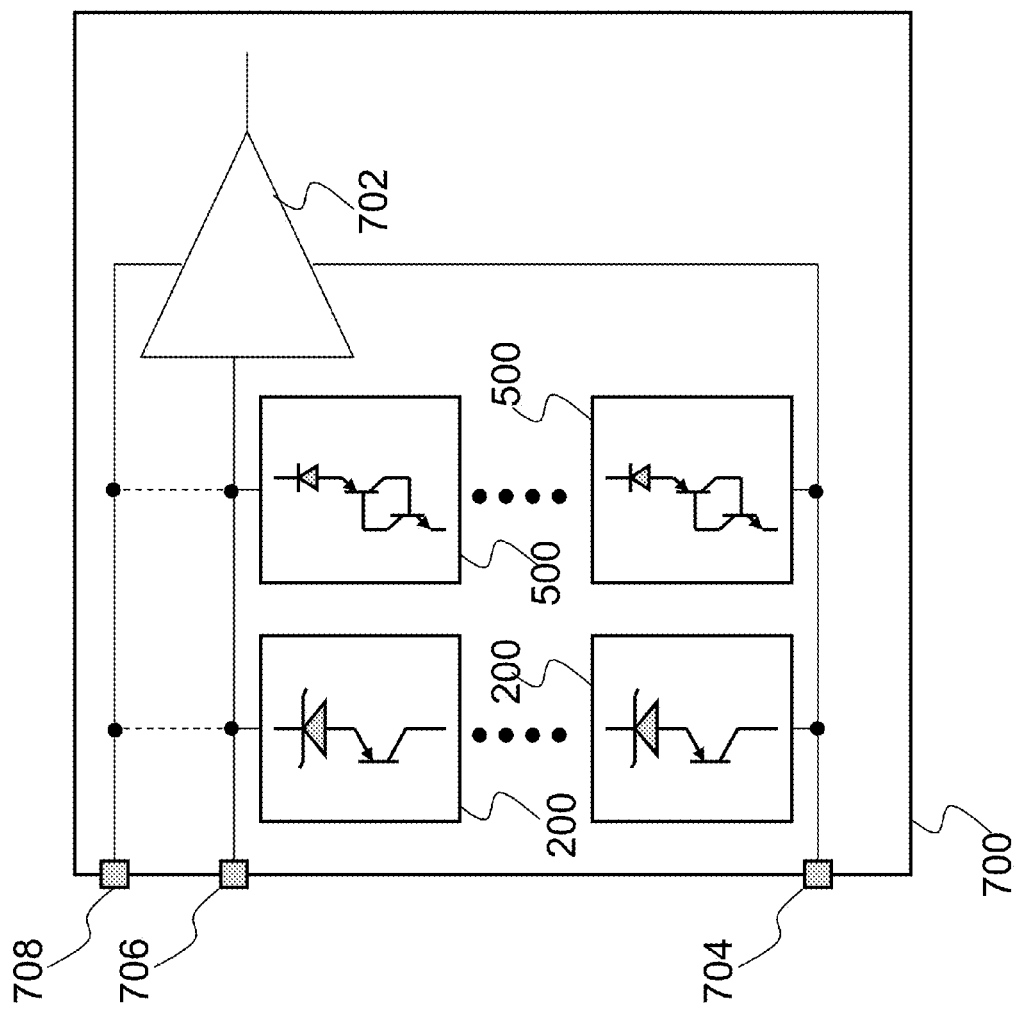
FIG. 8 illustrates a further ESD protection scheme by employing a plurality of ESD protection circuits in series connection.

FIG. 8 illustrates a further ESD protection scheme by employing a plurality of ESD protection circuits in series connection between an I/O pad and a VSS pad. Similar to FIG. 7, FIG. 8 includes an integrated circuit 700, a VDD pad 708, an I/O pad 706, a VSS pad 704 and internal circuits 702. However, FIG. 8 further includes a series connection of ESD protection circuits electrically coupled to the I/O pad 706 and the VSS pad 704. In high voltage applications, a single ESD protection circuit such as the ESD protection circuit 200 shown in FIG. 7 may not provide a reliable ESD protection. By contrast, a plurality of ESD protection circuits 200 in series connection may provide an adjustable ESD protection breakdown point as well as an adjustable ESD protection holding voltage.

In FIG. 8, if an ESD event occurs, a voltage spike is applied between the I/O pad 706 and the VSS pad 704. The series-connected ESD protection circuits may turn on nearly simultaneously. Each ESD protection circuit provides an ESD protection holding voltage. The sum of all series-connected ESD protection circuits' breakdown voltages clamps the I/O pad's voltage 706 to a level below the maximum rating voltage of the internal circuits 702, so that the internal circuits 702 are protected.

As described above with respect to FIG. 7, placing ESD devices between the I/O pad 706 and the VSS pad 704 in FIG. 8 is merely an example. One skilled in the art will recognize many variations, alternatives, and modifications, such as connecting ESD devices between the VDD pad 708 and VSS pad 704 as indicated by the dashed lines in FIG. 8.

In the embodiments, by disposing a high voltage P type implanted region underneath a N+ region, an ESD protection circuit provides a reliable ESD protection path as well as a higher ESD breakdown voltage.

In accordance with an embodiment, an ESD protection device has a diode having an anode electrically coupled to a first terminal of a semiconductor device having a breakdown characteristic. The diode further comprises a junction formed by a high voltage P type implanted region and a N+ region disposed on top of the high voltage P type implanted region. When a voltage across the ESD protection device exceeds the sum of the diode and semiconductor device's breakdown voltages, a current may flow through an ESD path formed by the diode and the semiconductor device.

In accordance with another embodiment, an ESD protection structure includes a high voltage N well, a high voltage P type implanted region which is disposed on top of the high voltage N well and partially within the high voltage N well and a first N+ region sequentially disposed on top of the high voltage P type implanted region. The structure further comprises a P+ region disposed on top of the high voltage N well and a second N+ region disposed on top of the high voltage N well. In the ESD protection structure, the first N+ region and the high voltage P type implanted region form a Zener diode and the Zener diode has a breakdown voltage between 5 and 7V. Furthermore, the high voltage P type implanted region, the high voltage N well and the P+ region form a bipolar PNP transistor. The bipolar PNP transistor is series-connected with the Zener diode to form an ESD protection circuit.

In accordance with yet another embodiment, an ESD protection structure comprises a N+ buried layer; a high voltage N well disposed on top of the N+ buried layer, a high voltage P type implanted region disposed on top of the high voltage N well and partially within the high voltage N well. The structure further comprises a first N+ region sequentially disposed on top of the high voltage P type implanted region, a high voltage P well disposed on top of the N+ buried layer, a second N+ region disposed on top of the high voltage P well and a P+ region disposed on top of the high voltage P well. In the structure, the first N+ region and the high voltage P type implanted region form a reverse diode and the reverse diode has a breakdown voltage. Furthermore, the high voltage P type implanted region, the high voltage N well and the high voltage P well form a bipolar PNP transistor; the high voltage N well, the high voltage P well and the second N+ region form a bipolar NPN transistor. The bipolar PNP transistor and the bipolar NPN transistor form a silicon-controlled rectifier (SCR). The SCR and the reverse diode in series connection form an ESD protection circuit.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrostatic discharge (ESD) protection device comprising:
   a diode having an anode electrically coupled to a first terminal of a semiconductor device, wherein the semiconductor device is a PNP transistor and comprises a high voltage N well and the diode comprises:
      a junction formed by a high voltage P type implanted region and a N+ region disposed on the high voltage P type implanted region, wherein a bottom portion of the high voltage P type implanted region is enclosed by the high voltage N well; and
   the semiconductor device having a first breakdown voltage, wherein the semiconductor device comprises the first terminal and a second terminal, wherein a current flows into the first terminal and flows out of the second terminal after a voltage across the first terminal and the second terminal exceeds the first breakdown voltage.

2. The device of claim 1, wherein the diode is a Zener diode.

3. The device of claim 2, wherein the Zener diode has a second breakdown voltage between 5 and 7V.

4. The device of claim 1, wherein the diode is a reverse diode.

5. The device of claim 1, wherein the semiconductor device is a bipolar PNP transistor.

6. The device of claim 5, wherein the bipolar PNP transistor has a base, which is either floating or electrically coupled to the diode.

7. The device of claim 1, wherein the semiconductor device is a silicon-controlled rectifier (SCR) and the SCR comprises:
a bipolar PNP transistor; and
a first bipolar NPN transistor.

8. The device of claim 7, wherein the bipolar PNP transistor has a base interconnected with the collector of the bipolar NPN transistor and a collector interconnected with the base of the bipolar NPN transistor.

9. An ESD protection structure comprising:
a high voltage N well;
a high voltage P type implanted region disposed on the high voltage N well and partially within the high voltage N well, wherein a bottom portion of the high voltage P type implanted region is enclosed by the high voltage N well;
a first N+ region disposed on the high voltage P type implanted region;
a P+ region disposed on the high voltage N well; and
a second N+ region disposed on the high voltage N well, wherein:
the first N+ region and the high voltage P type implanted region form a diode; and
the high voltage P type implanted region, the high voltage N well and the P+ region form a transistor.

10. The structure of claim 9 further comprising a first isolator, wherein the first N+ region is disposed at one side of the first isolator and the P+ region is disposed at the other side of the first isolator.

11. The structure of claim 9 further comprising a second isolator, wherein the first N+ region is disposed at one side of the second isolator and the second N+ region is disposed at the other side of the second isolator.

12. The structure of claim 9, wherein the first N+ region and the high voltage P type implanted region form a Zener diode and the Zener diode has a breakdown voltage between 5 and 7V.

13. The structure of claim 9, wherein the high voltage P type implanted region, the high voltage N well and the P+ region form a bipolar PNP transistor.

14. The structure of claim 13, wherein the high voltage N well is electrically coupled to the second N+ region.

* * * * *